United States Patent
Tanehashi et al.

(10) Patent No.: US 11,919,768 B2
(45) Date of Patent: Mar. 5, 2024

(54) VIBRATING MIRROR ELEMENT AND OPTICAL SCANNER

(71) Applicant: FUNAI ELECTRIC CO., LTD., Osaka (JP)

(72) Inventors: Kenji Tanehashi, Osaka (JP); Fuminori Tanaka, Osaka (JP); Kenichi Fujita, Osaka (JP)

(73) Assignee: FUNAI ELECTRIC CO., LTD., Osaka (JP)

(*) Notice: Subject to any disclaimer, the term of this patent is extended or adjusted under 35 U.S.C. 154(b) by 542 days.

(21) Appl. No.: 17/234,771

(22) Filed: Apr. 19, 2021

(65) Prior Publication Data

US 2021/0331911 A1 Oct. 28, 2021

(30) Foreign Application Priority Data

Apr. 23, 2020 (JP) .................. 2020-076545

(51) Int. Cl.
*G02B 26/08* (2006.01)
*B81B 3/00* (2006.01)
*G02B 26/10* (2006.01)

(52) U.S. Cl.
CPC .......... *B81B 3/004* (2013.01); *G02B 26/0833* (2013.01); *G02B 26/105* (2013.01); *B81B 2201/042* (2013.01)

(58) Field of Classification Search
None
See application file for complete search history.

(56) References Cited

U.S. PATENT DOCUMENTS

| | | | |
|---|---|---|---|
| 7,394,583 B2 | 7/2008 | Akedo et al. | |
| 10,841,548 B2 | 11/2020 | Tanaka et al. | |
| 11,366,308 B2 | 6/2022 | Tanaka et al. | |
| 2006/0245023 A1 | 11/2006 | Akedo et al. | |
| 2010/0014142 A1 | 1/2010 | Akedo et al. | |
| 2010/0079837 A1* | 4/2010 | Akedo | G02B 26/10 359/224.1 |
| 2021/0331911 A1* | 10/2021 | Tanehashi | G02B 26/105 |
| 2022/0308336 A1* | 9/2022 | Chiba | H10N 30/20 |

FOREIGN PATENT DOCUMENTS

| | | |
|---|---|---|
| CN | 107144959 | 9/2017 |
| CN | 111948804 | 11/2020 |
| EP | 2749526 | 7/2014 |
| EP | 3214480 | 9/2017 |
| EP | 3739373 | 11/2020 |
| JP | 2006293116 | 10/2006 |
| WO | 2012020788 | 2/2012 |

* cited by examiner

Primary Examiner — Jennifer D. Carruth
(74) Attorney, Agent, or Firm — JCIPRNET

(57) ABSTRACT

Provided is a vibrating mirror element including: a mirror part; a substrate made of metal, including a pair of beams, a support supporting each of the pair of beams, and a torsion part swingably supporting the mirror part; a driving source generating a plate wave that swings the mirror part; and a vibration suppression part suppressing vibration transmitted to the pair of beams. The vibration suppression part is configured to suppress the vibration transmitted to the pair of beams by abutting against the pair of beams at a position between a second mirror end among ends of the mirror part that is opposite a first mirror end near the support and the torsion part in a first direction in which the pair of beams extends.

12 Claims, 8 Drawing Sheets

VIBRATING MIRROR ELEMENT AND OPTICAL SCANNER

CROSS-REFERENCE TO RELATED APPLICATION

This application claims the priority benefit of Japan Application No. 2020-076545, filed on Apr. 23, 2020. The entirety of the above-mentioned patent application is hereby incorporated by reference herein and made a part of this specification.

BACKGROUND

Technical Field

The disclosure relates to a vibrating mirror element and an optical scanner.

Related Art

Conventionally, there are known a vibrating mirror element and an optical scanner (see, for example, Patent Document 1).

Patent Document 1 discloses an optical scanner including a substrate, a piezoelectric film, a twisted beam, and a mirror part.

The optical scanner disclosed in Patent Document 1 is configured so that the mirror part supported by the twisted beam is swung by use of a plate wave excited in the substrate by the piezoelectric film. The substrate has a frame-like shape provided with an opening, and the mirror part is provided inside the opening via the twisted beam. In addition, one end of the substrate disclosed in Patent Document 1 is supported in a cantilevered manner by a support member.

PATENT DOCUMENTS

[Patent Document 1] Japanese Patent Laid-open No. 2006-293116

Here, although not specified in Patent Document 1, as a scanner unit or the like including the vibrating mirror element is reduced in size, it is required that the vibrating mirror element be reduced in overall size after the size of the mirror part is increased. In addition, it is required that the mirror part be stably swung within a predetermined swing angle range in order to adapt to a use environment and a change in the use environment. However, in the case of attempting to increase the size of the mirror part arranged inside the substrate having a frame-like shape as in the optical scanner (vibrating mirror element) described in Patent Document 1, there is a problem that the substrate itself is also increased in size in order to avoid abutting against the mirror part. In addition, in the optical scanner (vibrating mirror element) described in Patent Document 1, since the substrate is supported in a cantilevered manner, not only vibration (plate wave) for swinging the mirror part about a swing axis but also vibration in a direction orthogonal to a surface of the mirror may be transmitted to the mirror part via the twisted beam (torsion part). In this case, there is a problem that it becomes difficult to stably swing the mirror part within the predetermined swing angle range. Therefore, there is a demand for a vibrating mirror element in which the mirror part is able to be stably swung while an increase in overall size of the vibrating mirror element is suppressed even if the mirror part is increased in size.

The disclosure provides a vibrating mirror element and an optical scanner in which the mirror part is able to be stably swung while an increase in overall size of the vibrating mirror element is suppressed even if the mirror part is increased in size.

SUMMARY

A vibrating mirror element according to a first aspect of the disclosure includes: a mirror part reflecting light; a substrate made of metal and including: a pair of beams each having a first end and a second end, a support supporting the first end of each of the pair of beams, and a torsion part swingably supporting the mirror part; a driving source provided on the support and generating a plate wave that swings the mirror part; and a vibration suppression part suppressing vibration transmitted to the pair of beams by abutting against the pair of beams. The torsion part extends in a second direction orthogonal to a first direction in which the pair of beams extends in a direction along a surface of the mirror part, and is connected to each of the pair of beams. The vibration suppression part is configured to suppress the vibration transmitted to the pair of beams by abutting against the pair of beams at a position between a second mirror end among ends of the mirror part that is opposite a first mirror end near the support and the torsion part in the first direction.

An optical scanner according to a second aspect of the disclosure includes: a light source irradiating light; a mirror part reflecting the light irradiated from the light source; a substrate made of metal and including: a pair of beams each having a first end and a second end, a support supporting the first end of each of the pair of beams, and a torsion part swingably supporting the mirror part; a driving source provided on the support and generating a plate wave that swings the mirror part; and a vibration suppression part suppressing vibration transmitted to the pair of beams by abutting against the pair of beams. The torsion part extends in a second direction orthogonal to a first direction in which the pair of beams extends in a direction along a surface of the mirror part, and is connected to each of the pair of beams. The vibration suppression part is configured to suppress the vibration transmitted to the pair of beams by abutting against the pair of beams at a position between a second mirror end among ends of the mirror part that is opposite a first mirror end near the support and the torsion part in the first direction.

DESCRIPTION OF THE EMBODIMENTS

Figure 1:
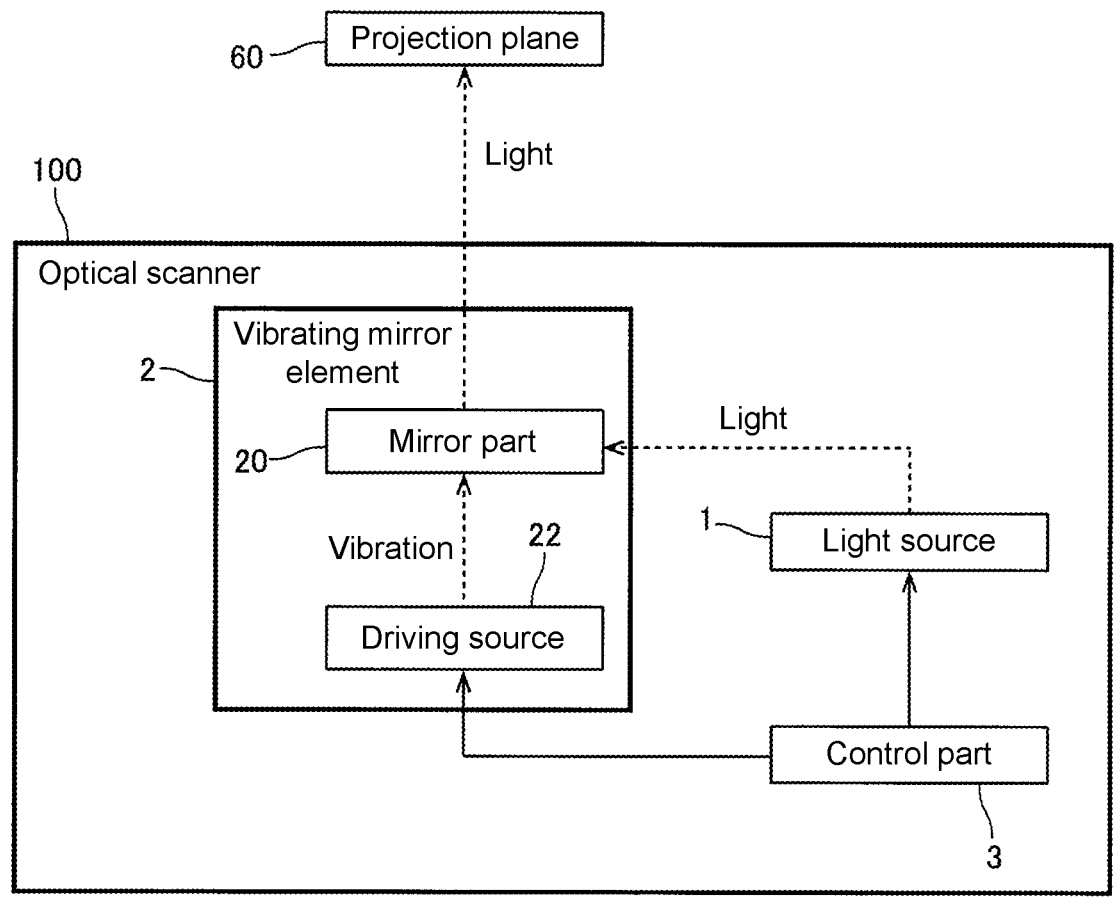
FIG. 1 is a block diagram showing an overall configuration of an optical scanner according to one embodiment.

A vibrating mirror element according to a first aspect of the disclosure includes: a mirror part reflecting light; a substrate made of metal and including: a pair of beams each having a first end and a second end, a support supporting the first end of each of the pair of beams, and a torsion part swingably supporting the mirror part; a driving source provided on the support and generating a plate wave that swings the mirror part; and a vibration suppression part suppressing vibration transmitted to the pair of beams by abutting against the pair of beams. The torsion part extends in a second direction orthogonal to a first direction in which the pair of beams extends in a direction along a surface of the mirror part, and is connected to each of the pair of beams. The vibration suppression part is configured to suppress the vibration transmitted to the pair of beams by abutting against the pair of beams at a position between a second mirror end among ends of the mirror part that is opposite a first mirror end near the support and the torsion part in the first direction.

As described above, the vibrating mirror element according to the first aspect of the disclosure includes the substrate made of metal and including the pair of beams, the support supporting the first ends of the pair of beams, and the torsion part swingably supporting the mirror part. Accordingly, since the first ends of the pair of beams are supported by the support, unlike a configuration in which the mirror part is arranged inside an opening provided in a frame-shaped substrate, even if the mirror part is increased in size, the mirror part is able to be prevented from abutting against the substrate at the second end side. Therefore, an increase in overall size of the vibrating mirror element is able to be suppressed while the mirror part is increased in size. In addition, since the vibration suppression part that suppresses the vibration transmitted to the pair of beams by abutting against the pair of beams is provided at the position between the second mirror end and the torsion part, not only the vibration for swinging the mirror part about the swing axis but also the vibration in the direction orthogonal to the surface of the mirror part is able to be prevented from being transmitted to the mirror part via the torsion part. Therefore, it is possible to prevent that a swing angle of the mirror part deviates from a predetermined swing angle range due to the vibration that causes the mirror part to swing in the direction orthogonal to the surface of the mirror part. As a result, even if the mirror part is increased in size, the mirror part is able to be stably swung while an increase in overall size of the vibrating mirror element is suppressed.

In the vibrating mirror element according to the first aspect, preferably, a holding member is further included that holds the support and each of the pair of beams. The holding member is configured to hold each of the pair of beams at a position where the vibration suppression part abuts against the pair of beams or at a position nearer the second end than the position where the vibration suppression part abuts against the pair of beams. With such a configuration, the substrate is held by the holding member at the support and the second end side of the pair of beams. Thus, unlike a configuration in which the substrate is held in a cantilever state by a support member, vibration of the substrate itself is able to be suppressed. As a result, since it is possible to suppress movement of a center position of swinging of the mirror part caused by vibration of the substrate itself, the mirror part is able to be relatively stably swung.

In this case, preferably, the vibration suppression part includes: a first vibration suppression part suppressing vibration by abutting against one of the pair of beams, and a second vibration suppression part provided separately from the first vibration suppression part and suppressing vibration by abutting against the other of the pair of beams. Each of the first vibration suppression part and the second vibration suppression part is provided separately from the substrate and the holding member. The holding member has a carrying surface carrying the first vibration suppression part and the second vibration suppression part. The carrying surface is formed so as to extend in the first direction. With such a configuration, positions of the first vibration suppression part and the second vibration suppression part are able to be individually adjusted. As a result, in one of the pair of beams and the other of the pair of beams, since it is possible to individually arrange the first vibration suppression part and the second vibration suppression part at positions where unnecessary vibration is able to be suppressed, the mirror part is able to be relatively stably swung.

In the vibrating mirror element according to the first aspect, preferably, the mirror part is configured so that a first distance from the torsion part to the second mirror end in the first direction is equal to or greater than a second distance from the torsion part to the second end in the first direction. With such a configuration, the second ends of the pair of beams are able to be prevented from being arranged farther from the torsion part than the second mirror end. As a result, since it is possible to prevent the second end from protruding more than the second mirror end in the first direction, an increase in the size of the vibrating mirror element in the first direction is able to be suppressed while the mirror part is increased in size.

In this case, preferably, the vibration suppression part is configured so that a third distance from the torsion part to an end of the vibration suppression part near the second end in the first direction is less than the first distance. With such a configuration, the end of the vibration suppression part near the second end is able to be prevented from being arranged farther from the torsion part than the second mirror end of the mirror part in the first direction. As a result, an increase in the size of the vibrating mirror element in the first direction is able to be suppressed.

In the vibrating mirror element according to the first aspect, preferably, the mirror part is provided separately from the substrate. The substrate further includes a mirror part arrangement part connected to the torsion part, the mirror part being arranged in the mirror part arrangement part. The torsion part is provided so as to extend in the second direction so as to overlap the mirror part, and is connected with the mirror part arrangement part at a position overlapping the mirror part in the second direction. With such a configuration, since the torsion part is connected with the mirror part arrangement part at the position overlapping the mirror part in the second direction, even if the length of the torsion part in the second direction is increased in order to increase the swing angle of the mirror part, an increase in the size of the substrate in the second direction is able to be suppressed. As a result, an increase in the size of the vibrating mirror element in the second direction is able to be suppressed.

In this case, preferably, the mirror part and the mirror part arrangement part are joined at at least two places by an adhesive having elasticity. With such a configuration, for example, even if the mirror part and the mirror part arrangement part are made of different materials and have different linear expansion coefficients from each other, the occurrence of distortion in the mirror part due to the difference in linear expansion coefficient between the mirror part and the mirror part arrangement part is able to be suppressed. As a result, it is possible to prevent that a scanning range of the light scanned by the mirror part is different from a predetermined scanning range due to distortion of the mirror part.

In the configuration in which the mirror part and the mirror part arrangement part are joined at at least two places by the adhesive having elasticity, preferably, the adhesive joins the mirror part and the mirror part arrangement part at least at two places at substantially equal distances from a center of gravity of the mirror part or from a center of a surface of the mirror part. With such a configuration, since the mirror part and the mirror part arrangement part are joined at positions at substantially equal distances from the center of gravity of the mirror part or from the center of the surface of the mirror part, weight unbalance after joining is able to be suppressed. As a result, when the mirror part is swung, since it is possible to suppress the occurrence of unnecessary vibration due to weight unbalance between the mirror part and the mirror part arrangement part, the mirror part is able to be stably swung.

In the configuration in which the torsion part is connected with the mirror part arrangement part at the position overlapping the mirror part in the second direction, preferably, the mirror part arrangement part is thinned and formed into a beam shape so as to have a symmetrical mass on a reference plane containing the center of gravity of the mirror part or the center of the surface of the mirror part. With such a configuration, compared to a configuration in which the mirror part arrangement part is not thinned and has a flat plate shape, the mirror part arrangement part is able to be reduced in weight. In addition, since thinning is performed so that a symmetrical mass is achieved on the reference plane containing the center of gravity of the mirror part or the center of the surface of the mirror part, weight unbalance of the mirror part arrangement part after thinning is able to be suppressed. As a result, while the mirror part is stably swung, electric power required to swing the mirror part at a predetermined swing angle is able to be reduced.

In the vibrating mirror element according to the first aspect, preferably, a weight member is provided on the driving source or the pair of beams. With such a configuration, if the weight member is provided on the driving source, since it is possible to suppress unnecessary vibration, attenuation of the vibration applied from the driving source is able to be suppressed. If the weight member is provided on the pair of beams, since it is possible to increase the vibration applied from the driving source, the swing angle of the mirror part is able to be easily increased.

In the vibrating mirror element according to the first aspect, preferably, a treatment preventing reflection of the light reflected by the mirror part is applied to at least one of a portion of the substrate in the vicinity of the mirror part and a surface of the driving source. With such a configuration, it is possible to prevent the light irradiated to the mirror part from being reflected by at least one of the substrate in the vicinity of the mirror part and the surface of the driving source. Therefore, the light reflected by a component other than the mirror part is able to be prevented from becoming noise of scanning light.

An optical scanner according to a second aspect of the disclosure includes: a light source irradiating light; a mirror part reflecting the light irradiated from the light source; a substrate made of metal and including: a pair of beams each having a first end and a second end, a support supporting the first end of each of the pair of beams, and a torsion part swingably supporting the mirror part; a driving source provided on the support and generating a plate wave that swings the mirror part; and a vibration suppression part suppressing vibration transmitted to the pair of beams by abutting against the pair of beams. The torsion part extends in a second direction orthogonal to a first direction in which the pair of beams extends in a direction along a surface of the mirror part, and is connected to each of the pair of beams. The vibration suppression part is configured to suppress the vibration transmitted to the pair of beams by abutting against the pair of beams at a position between a second mirror end among ends of the mirror part that is opposite a first mirror end near the support and the torsion part in the first direction.

As described above, the optical scanner according to the second aspect of the disclosure includes the substrate made of metal and including the pair of beams, the support supporting the first ends of the pair of beams, and the torsion part swingably supporting the mirror part, as well as the vibration suppression part configured to suppress the vibration transmitted to the pair of beams by abutting against the pair of beams at the position between the second mirror end and the torsion part. Accordingly, like the vibrating mirror element of the first aspect, even if the mirror part is increased in size, the mirror part is able to be stably swung while an increase in overall size of the vibrating mirror element is suppressed.

As described above, according to the disclosure, the vibrating mirror element and the optical scanner are able to be provided in which the mirror part is able to be stably swung while an increase in overall size of the vibrating mirror element is suppressed even if the mirror part is increased in size.

Hereinafter, embodiments of the disclosure will be described with reference to the drawings.

Referring to FIG. 1 to FIG. 8, a configuration of a vibrating mirror element 2 and a configuration of an optical scanner 100 including the vibrating mirror element 2 according to one embodiment are described.

(Configuration of Optical Scanner)

As shown in FIG. 1, the optical scanner 100 according to the present embodiment includes a light source 1, a vibrating mirror element 2, and a control part 3. The optical scanner 100 is configured to irradiate a projection plane 60 with light.

The light source 1 is configured to output light. Specifically, the light source 1 is configured to irradiate, via a lens or the like, a mirror part 20 included in the vibrating mirror element 2. The light source 1 includes, for example, a light emitting diode (LED) or a laser diode (LD).

The vibrating mirror element 2 is configured so that the light irradiated from the light source 1 is reflected by the mirror part 20 so as to be projected onto the projection plane 60 while the mirror part 20 is swung by a plate wave generated by a driving source 22. A detailed configuration of the vibrating mirror element 2 will be described later.

The control part 3 is configured to control irradiation of laser light by the light source 1. Specifically, the control part 3 is configured to control the timing of each of blue laser light, red laser light, and green laser light irradiated from the light source 1.

The control part 3 is configured to control each part of the optical scanner 100. The control part 3 is configured to acquire from the outside a video signal to be projected onto the projection plane 60. The control part 3 is configured to control the irradiation of laser light by the light source 1 based on the acquired video signal. The control part 3 includes, for example, a processor such as a central processing unit (CPU).

(Configuration of Vibrating Mirror Element)

Figure 2:
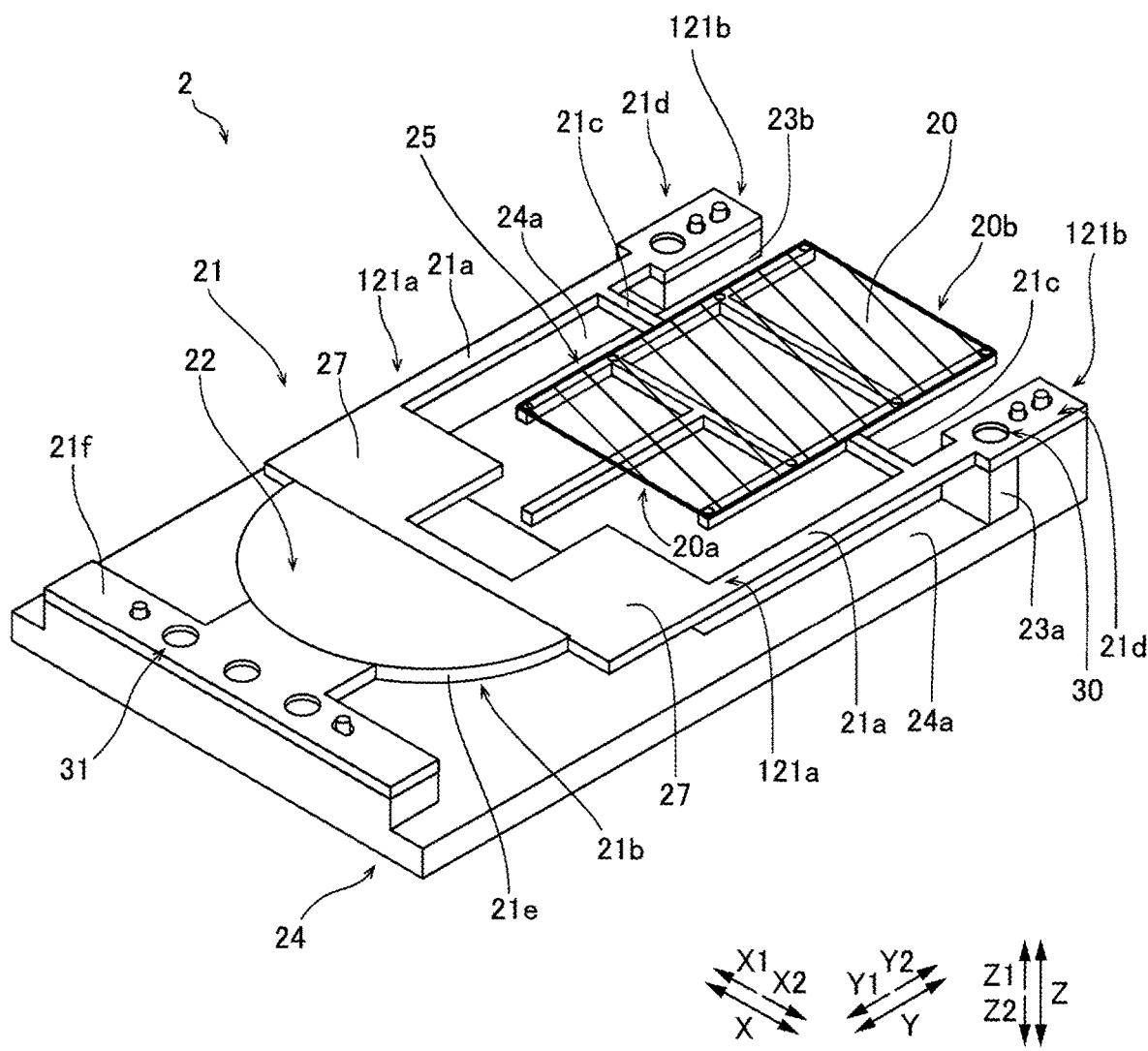
FIG. 2 is a perspective view of a vibrating mirror element according to one embodiment.

As shown in FIG. 2, the vibrating mirror element 2 includes the mirror part 20, a substrate 21, the driving source 22, a vibration suppression part, and a holding member 24. In the present specification, a direction orthogonal to a surface of the mirror part 20 is taken as a Z direction, an upward direction is taken as a Z1 direction, and a downward direction is taken as a Z2 direction. Two directions orthogonal to each other in a plane orthogonal to the Z direction are taken as an X direction and a Y direction, respectively. One side of the X direction is taken as an X1 direction and the other side thereof is taken as an X2 direction. One side of the Y direction is taken as a Y1 direction and the other side thereof is taken as a Y2 direction.

The mirror part 20 is configured to reflect the light irradiated from the light source 1. The mirror part 20 has a rectangular shape. In addition, the mirror part 20 is made of, for example, an aluminum material. In the present embodiment, the mirror part 20 is provided separately from the substrate 21. Specifically, the mirror part 20 is provided in a mirror part arrangement part 25. In the example shown in FIG. 2, the mirror part 20 is shown with hatching for convenience.

The substrate 21 includes a pair of beams 21a, a support 21b, and a torsion part 21c. In addition, the substrate 21 includes the mirror part arrangement part 25 in which the mirror part 20 is arranged. The substrate 21 is made of, for example, a stainless steel material having a flat plate shape.

The pair of beams 21a each have a first end 121a and a second end 121b. Each of the first ends 121a is supported by the support 21b. In the present embodiment, the pair of beams 21a is supported by the support 21b via a weight member 27. That is, the first end 121a is a portion connected with the weight member 27. The second end 121b is an end of the pair of beams 21a that is not connected to the weight member 27 in a first direction (Y direction). In the example shown in FIG. 2, a holding part 21d held by the holding member 24 is provided on the second end 121b side of the pair of beams 21a. The holding part 21d is a portion of the pair of beams 21a.

In the example shown in FIG. 2, the holding part 21d is formed by increasing a width of the second end 121b side of the pair of beams 21a in the X direction. The holding part 21d is held by the holding member 24, for example, by being screwed thereto. Hence, the holding part 21d is provided with a through hole 30 penetrating in the Z direction.

The support 21b is configured to support the first end 121a of each of the pair of beams 21a. The support 21b is provided with the driving source 22. Specifically, the support 21b includes a driving source support 21e that supports the driving source 22, and the driving source 22 is arranged in the driving source support 21e. The driving source support 21e has a semicircular shape, like the driving source 22. The support 21b includes a holding part 21f at an end on the side that does not support the pair of beams 21a in the first direction (Y direction). The support 21b is held by the holding member 24, for example, by being screwed thereto. Hence, the holding part 21f is provided with a through hole 31 penetrating in the Z direction.

The torsion part 21c swingably supports the mirror part 20. The torsion part 21c extends in a second direction (X direction) orthogonal to the first direction (Y direction) in which the pair of beams 21a extends in a direction along the surface of the mirror part 20. The torsion part 21c has a columnar shape. The torsion part 21c is provided as a pair. One of the pair of torsion parts 21c is connected with one of the pair of beams 21a, and the other torsion part 21c is connected to the other beam 21a. Each of the pair of torsion parts 21c is connected to the mirror part arrangement part 25.

The mirror part arrangement part 25 is configured so that the mirror part 20 is arranged therein. The mirror part arrangement part 25 is connected to the pair of beams 21a via the torsion part 21c. A detailed configuration of the mirror part arrangement part 25 will be described later.

The driving source 22 is configured to generate the plate wave that swings the mirror part 20. The driving source 22 includes, for example, a piezoelectric element. The piezoelectric element includes, for example, lead zirconate titanate (PZT). In the example shown in FIG. 2, PZT having a semicircular shape is provided as the driving source 22 on the substrate 21.

The vibration suppression part is configured to suppress vibration transmitted to the pair of beams 21a by abutting against the pair of beams 21a. The vibration suppression part includes: a first vibration suppression part 23a, suppressing vibration by abutting against one of the pair of beams 21a; and a second vibration suppression part 23b, provided separately from the first vibration suppression part 23a and suppressing vibration by abutting against the other of the pair of beams 21a. Each of the first vibration suppression part 23a and the second vibration suppression part 23b is provided separately from the substrate 21 and the holding member 24. Each of the first vibration suppression part 23a and the second vibration suppression part 23b has an abutting surface 123a (see FIG. 5) abutting against the beam 21a. Details of positions where the first vibration suppression part 23a and the second vibration suppression part 23b abut against the pair of beams 21a or the like will be described later.

The holding member 24 is configured to hold the support 21b. As shown in FIG. 2, the holding member 24 holds the holding part 21f provided at the end of the support 21b on the side that does not support the pair of beams 21a in the first direction (Y direction). The holding member 24 is configured to hold each of the pair of beams 21a. As shown in FIG. 2, the holding member 24 is configured to hold the holding part 21d of the pair of beams 21a.

As shown in FIG. 2, the holding member 24 is configured to hold each of the pair of beams 21a at a position where the vibration suppression part abuts against the pair of beams 21a or at a position nearer the second end 121b than the position where the vibration suppression part abuts against the pair of beams 21a. In the example shown in FIG. 2, the holding member 24 holds each of the pair of beams 21a at the position nearer the second end 121b than the position where the vibration suppression part abuts against the pair of beams 21a.

The holding member 24 has a carrying surface 24a carrying the first vibration suppression part 23a and the second vibration suppression part 23b. The carrying surface 24a is formed so as to extend in the first direction (Y direction). The carrying surface 24a is portion of a surface of the holding member 24 on the Z1 direction side, extending in a direction (Y direction) in which the pair of beams 21a extends below (Z2 direction side) the pair of beams 21a.

Figure 3:
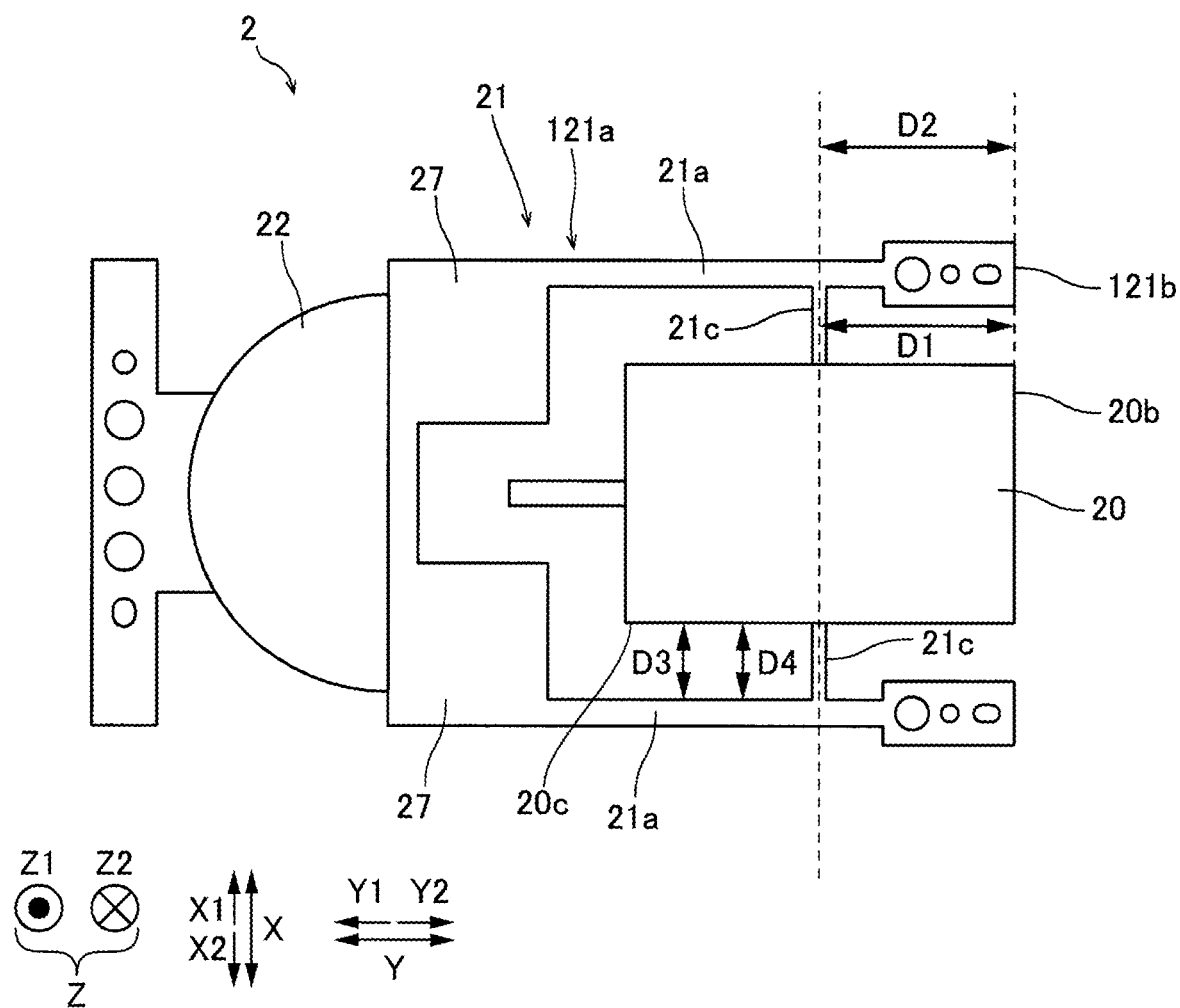
FIG. 3 is a plan view of a vibrating mirror element according to one embodiment.

As shown in FIG. 3, in the substrate 21, the pair of beams 21a is supported by the support 21b. Therefore, in the present embodiment, the substrate 21 has a U-shape in plan view. Although not shown in FIG. 3, the holding member 24 also has a U-shape, like the substrate 21.

The driving source 22 or the pair of beams 21a is provided with the weight member 27. As shown in FIG. 3, in the present embodiment, the weight member 27 is provided integrally with the substrate 21 on the first end 121a side of the pair of beams 21a. Specifically, the weight member 27 is integrally provided on the substrate 21 by increasing the size of the first end 121a side in the X direction.

In the present embodiment, as shown in FIG. 3, the mirror part 20 is configured so that a first distance D1 from the torsion part 21c to a second mirror end 20b in the first direction (Y direction) is equal to or greater than a second distance D2 from the torsion part 21c to the second end 121b in the first direction. In the present embodiment, a length from the center of the torsion part 21c to the second mirror end 20b in the Y direction is taken as the first distance D1. A length from the center of the torsion part 21c to the second end 121b in the Y direction is taken as the second distance D2.

The torsion part 21c is connected to the mirror part arrangement part 25 at a position not overlapping the mirror part 20 in the second direction (X direction). Specifically, the torsion part 21c is connected to the mirror part arrangement part 25 at a position where a distance D3 from the beam 21a to an end 20c of the mirror part 20 in the X direction is equal to a length D4 of the torsion part 21c in the X direction.

(Swing of Mirror Part)

Figure 4:
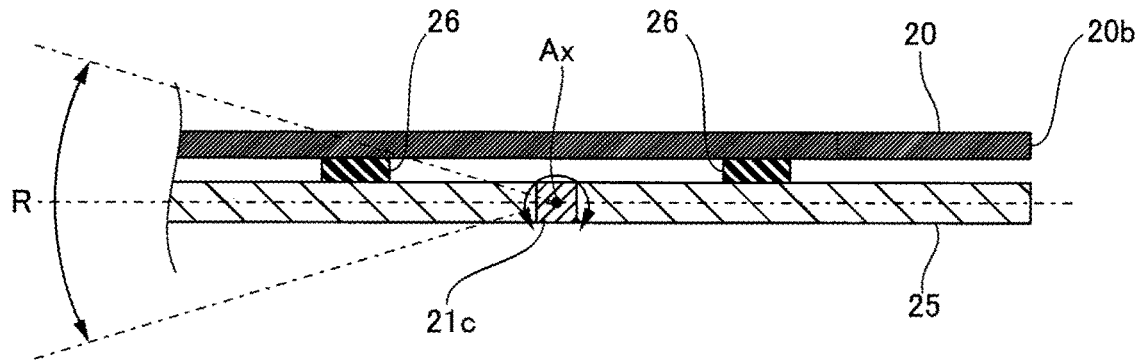
FIG. 4 is a schematic view of a vibrating mirror element as viewed from a direction in which a swing axis extends according to one embodiment.

As shown in FIG. 4, the mirror part 20 is swung about a swing axis Ax so as to have a predetermined swing angle R. In the present embodiment, the mirror part 20 is swung about the swing axis Ax by the plate wave generated by the driving source 22. Specifically, by expansion and contraction of the driving source 22 in a direction (direction parallel to an XY plane) parallel to a surface of the substrate 21, the substrate 21 is bent in the Z direction, thereby generating the plate wave. The plate wave generated by the driving source 22 is transmitted to the torsion part 21c via the pair of beams 21a. The torsion part 21c swings the mirror part arrangement part 25 by being twisted by the plate wave transmitted via the pair of beams 21a. The mirror part arrangement part 25 swings the mirror part 20 by being swung by the torsion part 21c. The torsion part 21c is arranged so as to be at a position corresponding to an antinode portion or a node portion of the plate wave generated by the driving source 22. The plate wave includes a symmetric plate wave and an asymmetric plate wave. In the case of the symmetric plate wave, a maximum point of amplitude is the antinode portion and a minimum point of amplitude is the node portion. In the case of the asymmetric plate wave, a portion where displacement becomes maximum is the antinode portion, and a portion where displacement becomes minimum is the node portion.

As shown in FIG. 4, the mirror part 20 and the mirror part arrangement part 25 are joined at at least two places by an adhesive 26 having elasticity. Since the mirror part 20 and the mirror part arrangement part 25 are joined by the adhesive 26 having elasticity, they are joined with a slight gap therebetween in the Z direction, as shown in FIG. 4. Accordingly, when the torsion part 21c is twisted, it is possible to prevent the torsion part 21c from abutting against the mirror part 20, and the mirror part 20 is able to be stably swung at the predetermined swing angle R. FIG. 4 does not show a cross section, and hatches are added to make it easy to identify the mirror part 20, the torsion part 21c, the mirror part arrangement part 25, and the adhesive 26.

(Abutment Position of Vibration Suppression Part)

Next, referring to FIG. 5, the position where the vibration suppression part abuts against the pair of beams 21a will be described. The vibration suppression part is configured to suppress the vibration transmitted to the pair of beams 21a by abutting against the pair of beams 21a at a position between the second mirror end 20b among the ends of the mirror part 20 that is opposite a first mirror end 20a near the support 21b and the torsion part 21c in the first direction (Y direction). Specifically, the vibration suppression part is configured to suppress transmission of the vibration that swings the substrate 21 in the Z direction to the pair of beams 21a.

Figure 5:
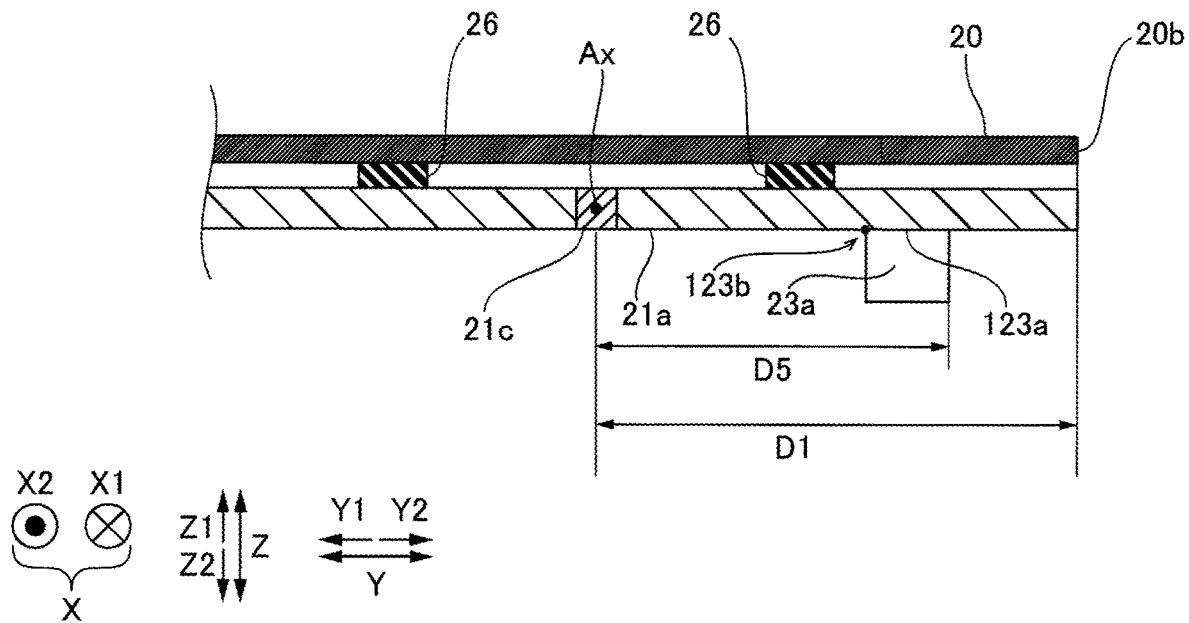
FIG. 5 is a schematic view for describing a position where a position where a vibration suppression part abuts against a pair of beams according to one embodiment.

As shown in FIG. 5, the first vibration suppression part 23a abuts against the beam on the X2 direction side among the pair of beams 21a from the Z2 direction side. At this time, the position of the first vibration suppression part 23a in the first direction (Y direction) is adjusted so that, in the abutting surface 123a of the first vibration suppression part 23a abutting against the beam, an abutting portion 123b of an end on the Y1 direction side is located between the second mirror end 20b and the torsion part 21c. The position of the abutting portion 123b is determined by the size of the mirror part 20, the thickness and length of the torsion part 21c, and the like. Although not shown in FIG. 5, the second vibration suppression part 23b abuts against the beam on the X1 direction side among the pair of beams 21a. The position of the second vibration suppression part 23b is adjusted in the same manner as the first vibration suppression part 23a. In other words, the first vibration suppression part 23a and the second vibration suppression part 23b are configured to suppress the occurrence of an unwanted vibration mode or suppress the intensity by adjusting a length (length from the abutting portion 123b to the first end 121a) of a vibrating portion of the pair of beams 21a.

The first vibration suppression part 23a is configured so that a third distance D5 from the torsion part 21c to an end of the first vibration suppression part 23a near the second end 121b in the first direction (Y direction) is less than the first distance D1. In the present embodiment, a length from the center of the torsion part 21c to the end of the first vibration suppression part 23a near the second end 121b in the Y direction is taken as the third distance D5. Although not shown in FIG. 5, in the second vibration suppression part 23b, a distance from the torsion part 21c to an end of the second vibration suppression part 23b near the second end 121b in the first direction (Y direction) is configured to be less than the first distance D1.

(Position where Mirror Part and Mirror Part Arrangement Part are Joined)

Next, referring to FIG. 6, a position where the mirror part 20 and the mirror part arrangement part 25 are joined by the adhesive 26 will be described.

The adhesive 26 joins the mirror part 20 and the mirror part arrangement part 25 at least at two places at substantially equal distances from the center of gravity G of the mirror part 20 or the center of the surface of the mirror part 20. In the example shown in FIG. 6, the adhesive 26 joins the mirror part 20 and the mirror part arrangement part 25 at eight places at substantially equal distances from the center of gravity G of the mirror part 20. Specifically, the adhesive 26 joins the mirror part 20 and the mirror part arrangement part 25 at eight places, i.e., a first joining position P1 to an eighth joining position P8.

Figure 6:
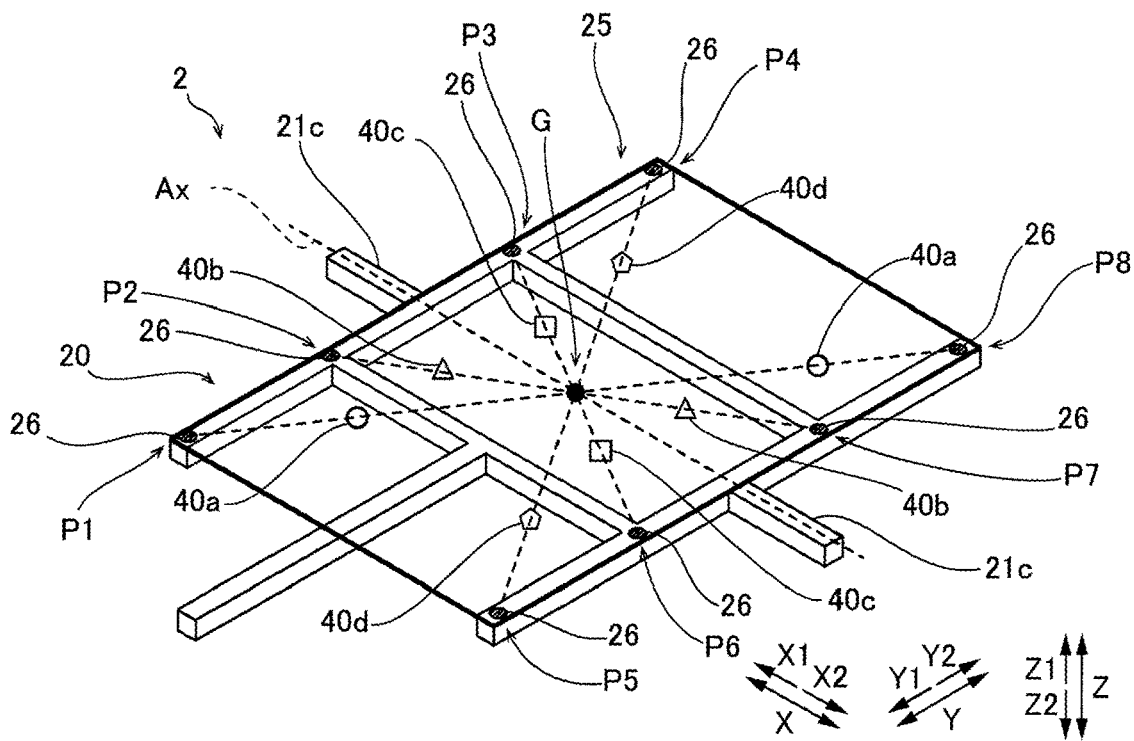
FIG. 6 is a perspective view for describing a position where a mirror part and a mirror part arrangement part are joined according to one embodiment.

In the example shown in FIG. 6, with respect to the adhesive 26 at the joining positions whose distances from the center of gravity G of the mirror part 20 are equal to each other, a common sign is attached on broken lines connecting arrangement positions of the adhesive 26 and the center of gravity G of the mirror part 20. That is, the first joining position P1 and the eighth joining position P8 that are attached with a first sign 40a are joining positions whose distances from the center of gravity G of the mirror part 20 are equal to each other. The second joining position P2 and the seventh joining position P7 that are attached with a second sign 40b are joining positions whose distances from the center of gravity G of the mirror part 20 are equal to each other. The third joining position P3 and the sixth joining position P6 that are attached with a third sign 40c are joining positions whose distances from the center of gravity G of the mirror part 20 are equal to each other. The fourth joining position P4 and the fifth joining position P5 that are attached with a fourth sign 40d are joining positions whose distances from the center of gravity G of the mirror part 20 are equal to each other.

(Configuration of Mirror Part Arrangement Part)

Figure 7:
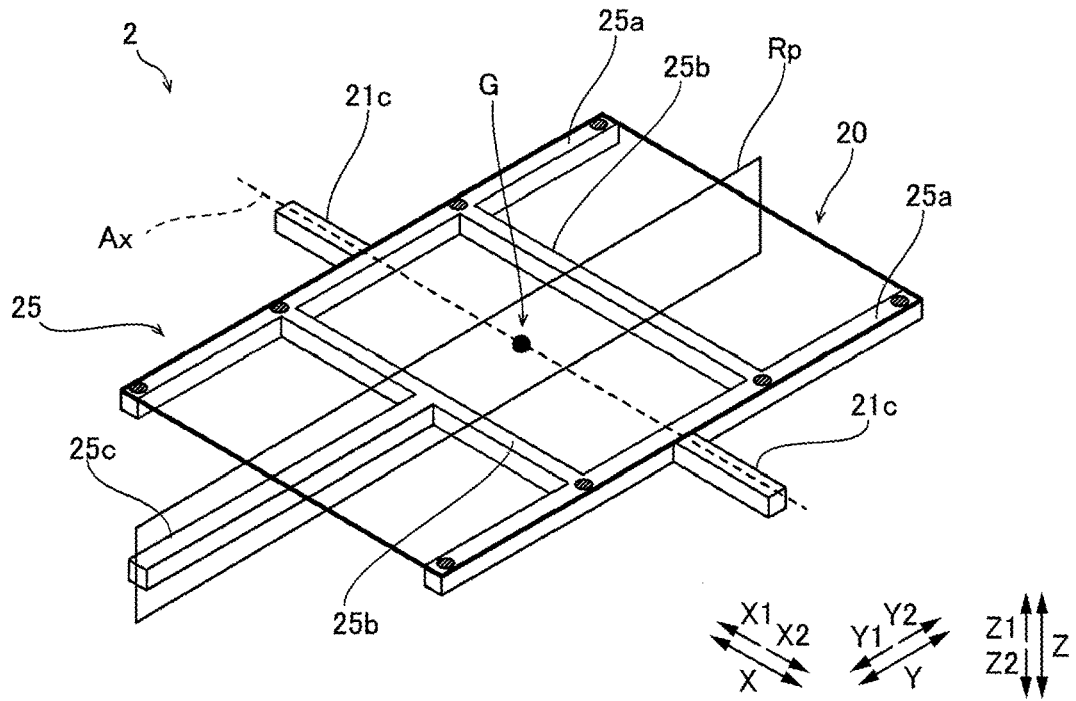
FIG. 7 is a perspective view for describing a structure of a mirror part arrangement part according to one embodiment.

As shown in FIG. 7, the mirror part arrangement part 25 is thinned and formed into a beam shape so as to have a symmetrical mass on a reference plane Rp containing the center of gravity G of the mirror part 20 or the center of the surface of the mirror part 20. In the example shown in FIG. 7, the reference plane Rp is a YZ plane. In the example shown in FIG. 7, the mirror part arrangement part 25 is thinned and formed into a beam shape so as to have a symmetrical mass on the reference plane Rp containing the center of gravity G of the mirror part 20. That is, the mirror part arrangement part 25 is thinned and formed into a beam shape so that the mass on the X1 direction side of the reference plane Rp and the mass on the X2 direction side of the reference plane Rp are equal to each other.

Specifically, the mirror part arrangement part 25 includes a pair of first beams 25a, a pair of second beams 25b, and a third beam 25c. The pair of first beams 25a is arranged so as to extend in the first direction (Y direction). The pair of second beams 25b is arranged so as to extend in the second direction (X direction). The third beam 25c is provided on the second beam 25b among the pair of second beams 25b that is provided on the Y1 direction side, and is arranged so as to extend in the first direction (Y direction). The torsion part 21c is connected to the pair of first beams 25a at the position not overlapping the mirror part 20 in the second direction (X direction).

(Antireflection Treatment)

Figure 8:
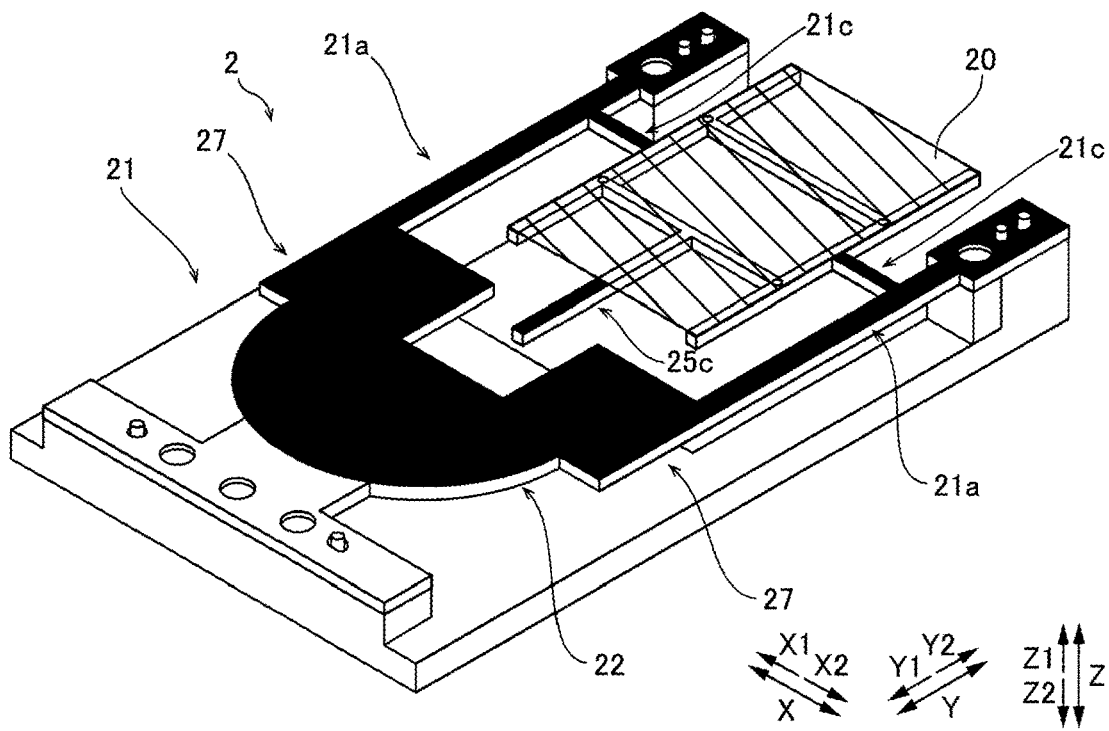
FIG. 8 is a perspective view for describing an antireflection treatment applied to a substrate according to one embodiment.

As shown in FIG. 8, a treatment preventing reflection of the light reflected by the mirror part 20 is applied to at least one of a portion of the substrate 21 in the vicinity of the mirror part 20 and a surface of the driving source 22. In the example shown in FIG. 8, an antireflection treatment is applied to both the vicinity of the mirror part 20 and the surface of the driving source 22. Specifically, in the present embodiment, in the substrate 21, the antireflection treatment is applied to portions of the pair of beams 21a, the torsion part 21c and the third beam 25c that do not overlap the mirror part 20, as well as to the surface of the driving source 22.

The antireflection treatment includes, for example, a treatment of applying a black paint to the vicinity of the mirror part 20 and the surface of the driving source 22. For example, the antireflection treatment may be applied by forming a black oxide film on the vicinity of the mirror part 20 and the surface of the driving source 22. In the case where the black oxide film is formed as the antireflection treatment, mechanical strength of the substrate 21 is able to be improved.

Effects of Present Embodiment

In the present embodiment, the following effects are able to be achieved.

As described above, in the present embodiment, the vibrating mirror element 2 includes: the mirror part 20 reflecting light; the substrate 21 made of metal and including: the pair of beams 21a each having the first end 121a and the second end 121b, the support 21b supporting the first end 121a of each of the pair of beams 21a, and the torsion part 21c swingably supporting the mirror part 20; the driving source 22 provided on the support 21b and generating the plate wave that swings the mirror part 20; and the vibration suppression part suppressing vibration transmitted to the pair of beams 21a by abutting against the pair of beams 21a. The torsion part 21c extends in the second direction orthogonal to the first direction in which the pair of beams 21a extends in the direction along the surface of the mirror part 20, and is connected to each of the pair of beams 21a. The vibration suppression part is configured to suppress the vibration transmitted to the pair of beams 21a by abutting against the pair of beams 21a at the position between the second mirror end 20b among the ends of the mirror part 20 that is opposite the first mirror end 20a near the support 21b and the torsion part 21c in the first direction.

Accordingly, since the first ends 121a of the pair of beams 21a are supported by the support 21b, unlike a configuration in which the mirror part 20 is arranged inside an opening provided in a frame-shaped substrate, even if the mirror part 20 is increased in size, the mirror part 20 is able to be prevented from abutting against the substrate 21 at the second end 121b side. Therefore, an increase in overall size of the vibrating mirror element 2 is able to be suppressed while the mirror part 20 is increased in size. In addition, since the vibration suppression part that suppresses the vibration transmitted to the pair of beams 21a by abutting against the pair of beams 21a is provided at the position between the second mirror end 20b and the torsion part 21c, not only the vibration for swinging the mirror part 20 about the swing axis Ax but also the vibration in the direction (Z direction) orthogonal to the surface of the mirror part 20 is able to be prevented from being transmitted to the mirror part 20 via the torsion part 21c. Therefore, it is possible to prevent that the swing angle R of the mirror part 20 deviates from a predetermined swing angle range due to the vibration that causes the mirror part 20 to swing in the Z direction. As a result, even if the mirror part 20 is increased in size, the mirror part 20 is able to be stably swung while an increase in overall size of the vibrating mirror element 2 is suppressed.

As described above, in the present embodiment, the holding member 24 that holds the support 21b and holds each of the pair of beams 21a is further provided. The holding member 24 is configured to hold each of the pair of beams 21a at the position where the vibration suppression part abuts against the pair of beams 21a or at the position nearer the second end 121b than the position where the vibration suppression part abuts against the pair of beams 21a. Accordingly, the substrate 21 is held by the holding member 24 at the support 21b and the second end 121b side of the pair of beams 21a. Thus, unlike a configuration in which the substrate 21 is held in a cantilever state by a support member, vibration of the substrate 21 itself is able to be suppressed. As a result, since it is possible to suppress movement of a center position of swinging of the mirror part 20 caused by vibration of the substrate 21 itself, the mirror part 20 is able to be relatively stably swung.

As described above, in the present embodiment, the vibration suppression part includes: the first vibration suppression part 23a, suppressing vibration by abutting against one of the pair of beams 21a; and the second vibration suppression part 23b, provided separately from the first vibration suppression part 23a and suppressing vibration by abutting against the other of the pair of beams 21a. Each of the first vibration suppression part 23a and the second vibration suppression part 23b is provided separately from the substrate 21 and the holding member 24. The holding member 24 has the carrying surface 24a carrying the first vibration suppression part 23a and the second vibration suppression part 23b. The carrying surface 24a is formed so as to extend in the first direction. Accordingly, positions of the first vibration suppression part 23a and the second vibration suppression part 23b are able to be individually adjusted. As a result, in one of the pair of beams 21a and the other of the pair of beams 21a, since it is possible to individually arrange the first vibration suppression part 23a and the second vibration suppression part 23b at positions where unnecessary vibration is able to be suppressed, the mirror part 20 is able to be relatively stably swung.

As described above, in the present embodiment, the mirror part 20 is configured so that the first distance D1 from the torsion part 21c to the second mirror end 20b in the first direction is equal to or greater than the second distance D2 from the torsion part 21c to the second end 121b in the first direction. Accordingly, the second ends 121b of the pair of beams 21a are able to be prevented from being arranged farther from the torsion part 21c than the second mirror end 20b. As a result, since it is possible to prevent the second end 121b from protruding more than the second mirror end 20b in the first direction (Y direction), an increase in the size of the vibrating mirror element 2 in the first direction is able to be suppressed while the mirror part 20 is increased in size.

As described above, in the present embodiment, the vibration suppression part is configured so that the third distance D5 from the torsion part 21c to an end of the vibration suppression part near the second end 121b in the first direction is less than the first distance D1. Accordingly, the end of the vibration suppression part near the second end 121b is able to be prevented from being arranged farther from the torsion part 21c than the second mirror end 20b of the mirror part 20 in the first direction. As a result, an increase in the size of the vibrating mirror element 2 in the first direction is able to be suppressed.

As described above, in the present embodiment, the mirror part 20 and the mirror part arrangement part 25 are joined at at least two places by the adhesive 26 having elasticity. Accordingly, for example, even if the mirror part 20 and the mirror part arrangement part 25 are made of different materials and have different linear expansion coefficients from each other, the occurrence of distortion in the mirror part 20 due to the difference in linear expansion coefficient between the mirror part 20 and the mirror part arrangement part 25 is able to be suppressed. As a result, it is possible to prevent that a scanning range of the light scanned by the mirror part 20 is different from a predetermined scanning range due to distortion of the mirror part 20.

As described above, in the present embodiment, the adhesive 26 joins the mirror part 20 and the mirror part arrangement part 25 at least at two places at substantially equal distances from the center of gravity G of the mirror part 20 or the center of the surface of the mirror part 20. Accordingly, since the mirror part 20 and the mirror part arrangement part 25 are joined at positions at substantially equal distances from the center of gravity G of the mirror part 20 or from the center of the surface of the mirror part 20, weight unbalance after joining is able to be suppressed. As a result, when the mirror part 20 is swung, since it is possible to suppress the occurrence of unnecessary vibration due to weight unbalance between the mirror part 20 and the mirror part arrangement part 25, the mirror part 20 is able to be stably swung.

As described above, in the present embodiment, the mirror part arrangement part 25 is thinned and formed into a beam shape so as to have a symmetrical mass on the reference plane Rp containing the center of gravity G of the mirror part 20 or the center of the surface of the mirror part 20. Accordingly, compared to a configuration in which the mirror part arrangement part 25 is not thinned and has a flat plate shape, the mirror part arrangement part 25 is able to be reduced in weight. In addition, since thinning is performed so that a symmetrical mass is achieved on the reference plane Rp containing the center of gravity G of the mirror part 20 or the center of the surface of the mirror part 20, weight unbalance of the mirror part arrangement part 25 after thinning is able to be suppressed. As a result, while the mirror part 20 is stably swung, electric power required to swing the mirror part 20 at the predetermined swing angle R is able to be reduced.

As described above, in the present embodiment, the driving source 22 or the pair of beams 21a is provided with the weight member 27. Accordingly, if the weight member 27 is provided on the driving source 22, since it is possible to suppress unnecessary vibration, attenuation of the vibration applied from the driving source 22 is able to be suppressed. If the weight member 27 is provided on the pair of beams 21a, since it is possible to increase the vibration applied from the driving source 22, the swing angle R of the mirror part 20 is able to be easily increased.

As described above, in the present embodiment, the treatment preventing reflection of the light reflected by the mirror part 20 is applied to at least one of the portion of the substrate 21 in the vicinity of the mirror part 20 and the surface of the driving source 22. Accordingly, it is possible to prevent the light irradiated to the mirror part 20 from being reflected by at least one of the substrate 21 in the vicinity of the mirror part 20 and the surface of the driving source 22. Therefore, the light reflected by a component other than the mirror part 20 is able to be prevented from becoming noise of scanning light.

As described above, in the present embodiment, the optical scanner 100 includes: the light source 1 irradiating light; the mirror part 20 reflecting the light irradiated from the light source 1; the substrate 21 made of metal and including: the pair of beams 21a each having the first end 121a and the second end 121b, the support 21b supporting the first end 121a of each of the pair of beams 21a, and the torsion part 21c swingably supporting the mirror part 20; the driving source 22 provided on the support 21b and generating the plate wave that swings the mirror part 20; and the vibration suppression part suppressing vibration transmitted to the pair of beams 21a by abutting against the pair of beams 21a. The torsion part 21c extends in the second direction orthogonal to the first direction in which the pair of beams 21a extends in the direction along the surface of the mirror part 20, and is connected to each of the pair of beams 21a. The vibration suppression part is configured to suppress the vibration transmitted to the pair of beams 21a by abutting against the pair of beams 21a at the position between the second mirror end 20b among the ends of the mirror part 20 that is opposite the first mirror end 20a near the support 21b and the torsion part 21c in the first direction. Accordingly, like the vibrating mirror element 2, the optical scanner 100 is able to be provided in which the mirror part 20 is able to be stably swung while an increase in overall size of the vibrating mirror element 2 is suppressed even if the mirror part 20 is increased in size.

Modifications

The embodiments disclosed herein are examples in all aspects and should not be interpreted as limitations. The scope of the disclosure is defined by claims instead of the above description of the embodiments, and moreover, includes all modifications within the scope of the claims and the equivalents thereof.

Figure 9:
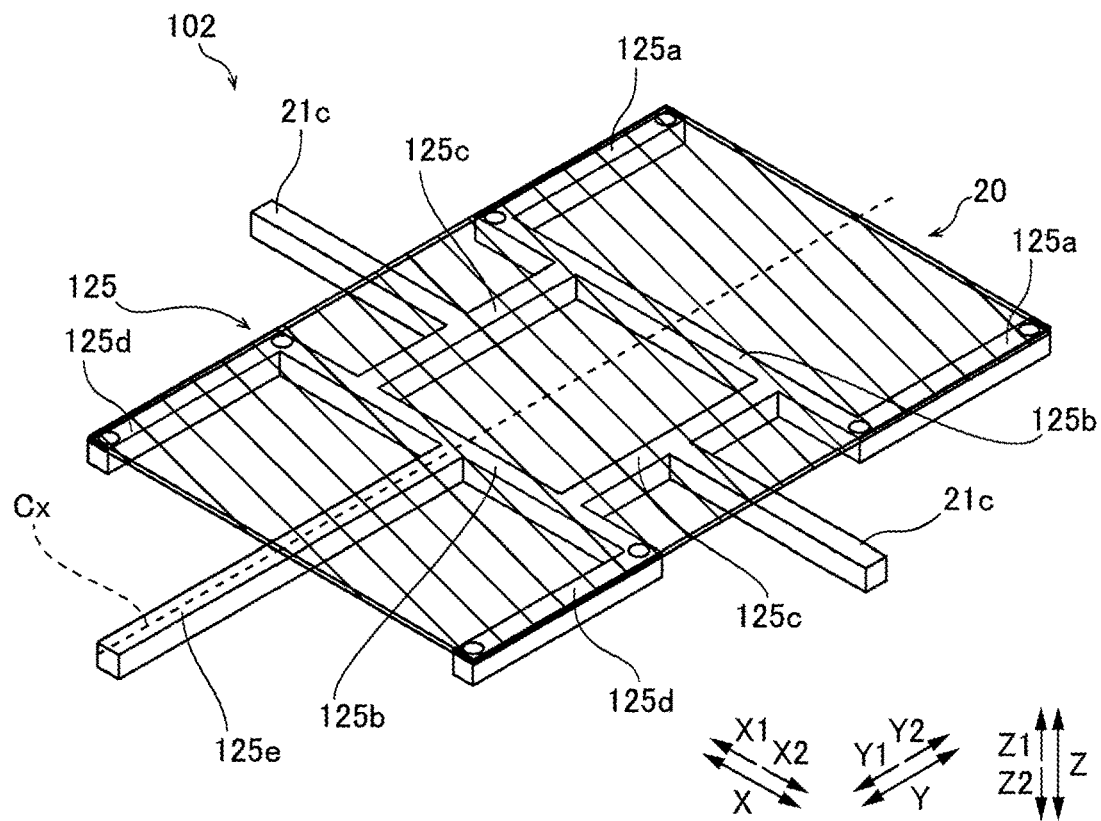
FIG. 9 is a perspective view for describing a configuration of a mirror part arrangement part according to a first modification.

For example, in the above embodiments, a configuration example is shown in which the torsion part 21c is connected with the mirror part arrangement part 25 at the position not overlapping the mirror part 20 in the second direction (X direction). However, the disclosure is not limited thereto. For example, as in a vibrating mirror element 102 according to a first modification shown in FIG. 9, the torsion part 21c is provided so as to extend in the second direction (X direction) so as to overlap the mirror part 20, and is connected with a mirror part arrangement part 125 at a position overlapping the mirror part 20 in the second direction.

In the first modification, the mirror part arrangement part 125 includes a pair of first beams 125a, a pair of second beams 125b, a pair of third beams 125c, a pair of fourth beams 125d, and a fifth beam 125e. Each of the pair of first beams 125a, the pair of third beams 125c and the pair of fourth beams 125d is arranged so as to extend in the first direction (Y direction). The pair of second beams 125b is arranged so as to extend in the second direction (X direction). An end of the pair of first beams 125a on the Y1 direction side is connected with the second beam 125b among the pair of second beams 125b that is provided on the Y2 direction side. The pair of third beams 125c is connected with each of the pair of second beams 125b. An end of the pair of fourth beams 125d on the Y2 direction side is connected with the second beam 125b provided on the Y1 direction side.

The third beam 125c is arranged inside the mirror part 20 than the first beam 125a and the fourth beam 125d. Specifically, the third beam 125c provided on the X1 direction side is provided nearer the X2 direction side than the first beam 125a and the fourth beam 125d provided on the X1 direction side, and is provided nearer the X1 direction side than a center line Cx passing through the center of the mirror part 20 in the second direction (X direction) and extending in the first direction (Y direction). The third beam 125c provided on the X2 direction side is provided nearer the X1 direction side than the first beam 125a and the fourth beam 125d provided on the X2 direction side, and is provided nearer the X2 direction side than the center line Cx.

The fourth beam 125d is provided on the second beam 125b among the pair of second beams 125b that is provided on the Y1 direction side, and is arranged so as to extend in the first direction (Y direction). The torsion part 21c is connected to the pair of third beams 125c.

As described above, in the first modification, the mirror part 20 is provided separately from the substrate 21. The substrate 21 further includes the mirror part arrangement part connected to the torsion part 21c and in which the mirror part 20 is arranged. The torsion part 21c is provided so as to extend in the second direction (X direction) so as to overlap the mirror part 20, and is connected with the mirror part arrangement part 125 at the position overlapping the mirror part 20 in the second direction. Accordingly, since the torsion part 21c is connected with the mirror part arrangement part 125 at the position overlapping the mirror part 20 in the second direction, even if the length of the torsion part 21c in the second direction is increased in order to increase the swing angle R of the mirror part 20, an increase in the size of the substrate 21 in the second direction is able to be suppressed. As a result, an increase in the size of the vibrating mirror element 2 in the second direction is able to be suppressed.

In the above embodiments, a configuration example is shown in which the first vibration suppression part 23a and the second vibration suppression part 23b are separately provided. However, the disclosure is not limited thereto. For example, the first vibration suppression part 23a and the second vibration suppression part 23b may be integrally formed with each other.

Figure 10:
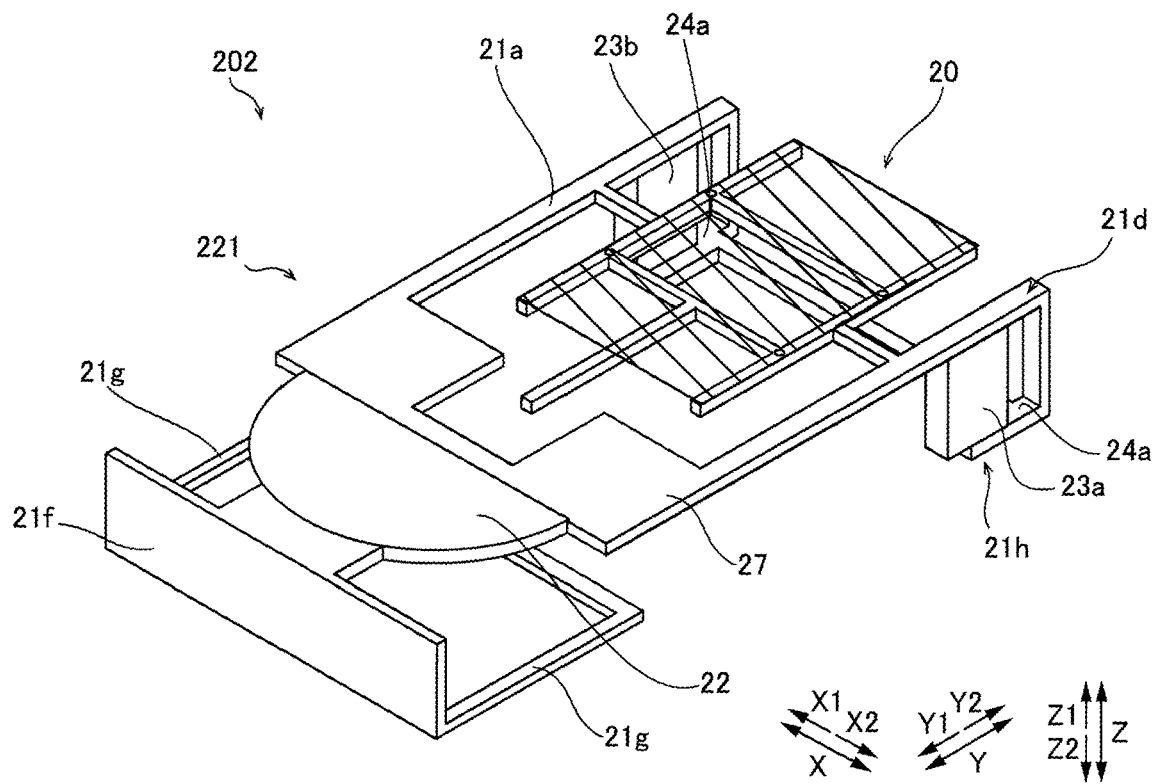
FIG. 10 is a perspective view for describing a configuration of a vibrating mirror element according to a second modification.

In the above embodiments, a configuration example is shown in which the substrate 21 and the holding member 24 are separately provided. However, the disclosure is not limited thereto. For example, as in a vibrating mirror element 202 according to a second modification shown in FIG. 10, a substrate and a holding member may be integrally formed with each other. Specifically, a holding part 21g may be formed by bending the holding part 21f. In the example shown in FIG. 10, the holding part 21g has a frame-like shape. A holding part 21h may be formed by bending the holding part 21d. The holding part 21h has the carrying surface 24a carrying the first vibration suppression part 23a and the second vibration suppression part 23b.

Figure 11:
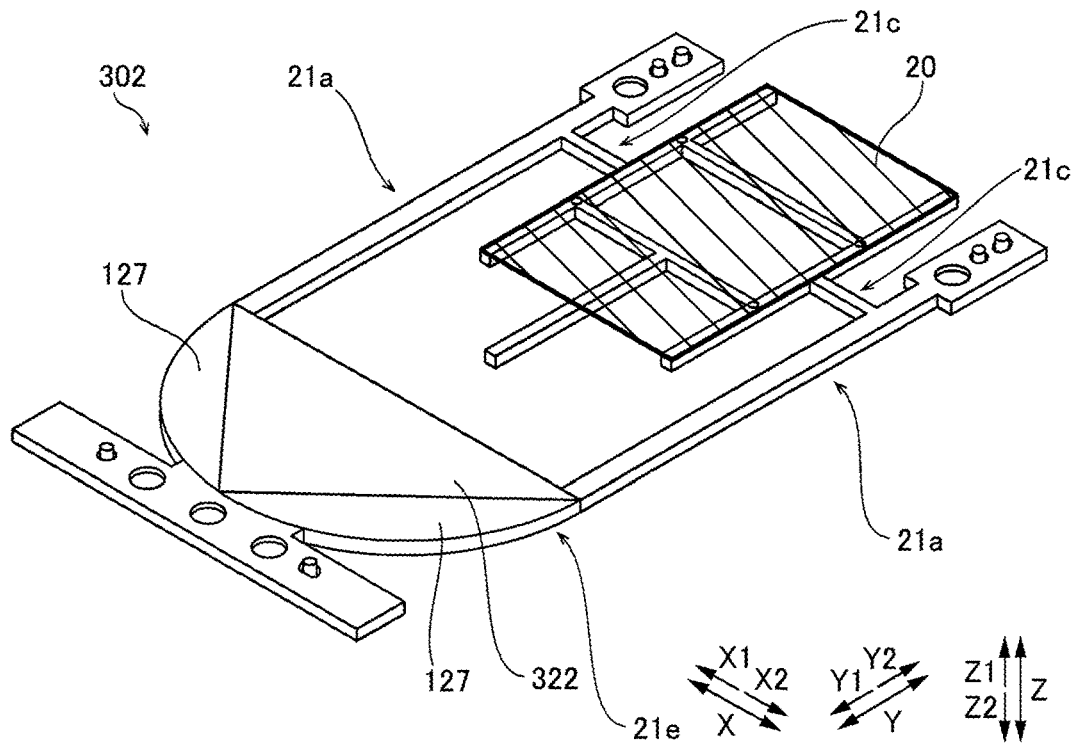
FIG. 11 is a perspective view for describing a configuration of a vibrating mirror element according to a third modification.

In the above embodiments, a configuration example is shown in which the weight member 27 is provided on the first end 121a side of the pair of beams 21a. However, the disclosure is not limited thereto. For example, a weight member 127 may be provided in the vicinity of a driving source 322 as in a vibrating mirror element 302 according to a third modification shown in FIG. 11. In the example shown in FIG. 11, the driving source 322 has a triangular shape. In the third modification, the support 21b has the same shape as that in the above embodiments. In the third modification, in the driving source support 21e that supports the driving source 322, a portion where the driving source 322 is not arranged is used as the weight member 127.

Figure 12:
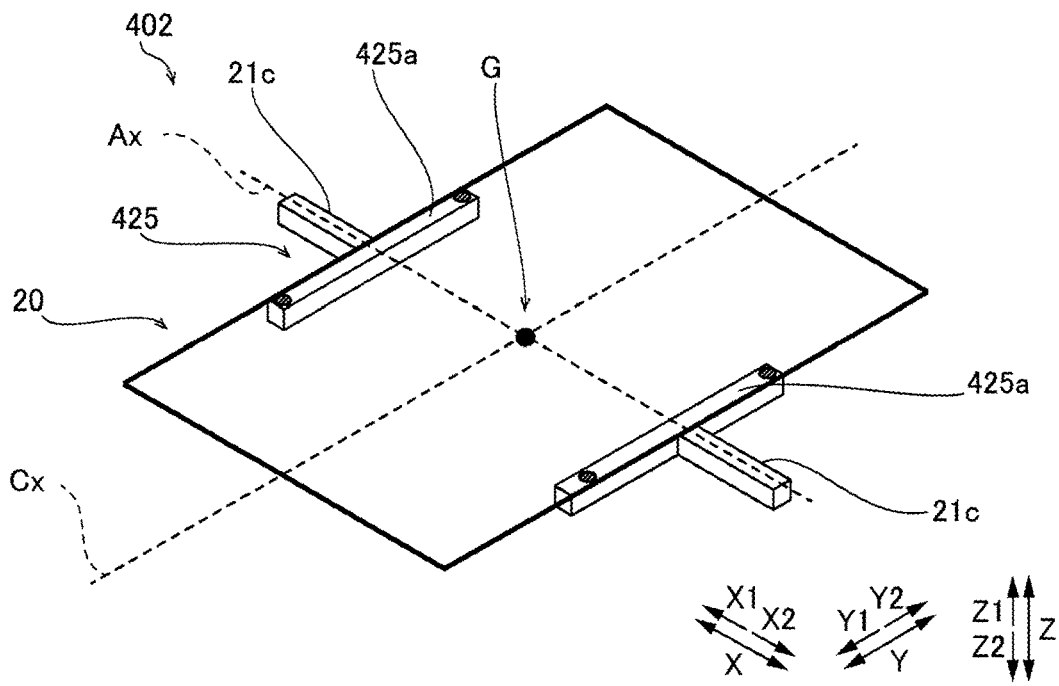
FIG. 12 is a perspective view for describing a configuration of a mirror part arrangement part according to a fourth modification.

In the above embodiments, a configuration example is shown in which the mirror part arrangement part 25 has the pair of first beams 25a, the pair of second beams 25b, and the third beam 25c. However, the disclosure is not limited thereto. For example, as in a vibrating mirror element 402 according to a fourth modification shown in FIG. 12, a mirror part arrangement part 425 may have only a pair of first beams 425a.

In the above embodiments, a configuration example is shown in which the mirror part 20 has a rectangular shape. However, the disclosure is not limited thereto. For example, as in a vibrating mirror element 502 according to a fifth modification shown in FIG. 13, a mirror part 520 may have a shape other than the rectangular shape. Even if the mirror part 520 has a shape other than the rectangular shape, the same effects may be achieved if the mirror part 520 and a mirror part arrangement part 525 are joined at a position where their distances from the center of gravity G of the mirror part 520 are equal to each other.

Figure 13:
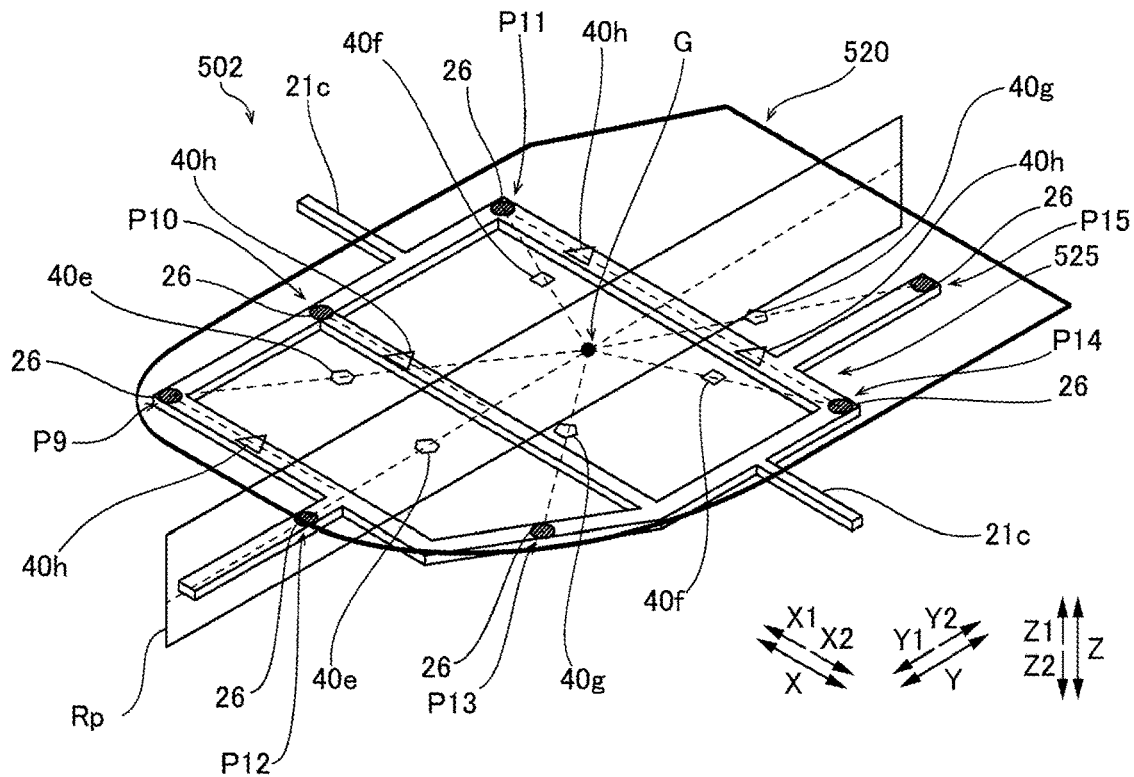
FIG. 13 is a perspective view for describing a configuration of a mirror part and a mirror part arrangement part according to a fifth modification.

In the example shown in FIG. 13, the mirror part 520 and the mirror part arrangement part 525 are joined at a ninth joining position P9 to a fifteenth joining position P15. Also, in the fifth modification, a common sign is attached on broken lines connecting the adhesive 26 located at positions at equal distances from the center of gravity G of the mirror part 520 and the center of gravity G of the mirror part 520. The ninth joining position P9 and the twelfth joining position P12 that are attached with a fifth sign 40e are joining positions whose distances from the center of gravity G of the mirror part 520 are equal to each other. The eleventh joining position P11 and the fourteenth joining position P14 that are attached with a sixth sign 40f are joining positions whose distances from the center of gravity G of the mirror part 520 are equal to each other. The thirteenth joining position P13 and the fifteenth joining position P15 that are attached with a seventh sign 40g are joining positions whose distances from the center of gravity G of the mirror part 520 are equal to each other.

In the fifth modification shown in FIG. 13, the ninth joining position P9 and the tenth joining position P10 are attached with an eighth sign 40h since their distances from the reference plane Rp are equal to each other. The eleventh joining position P11 and the fourteenth joining position P14 are attached with the eighth sign 40h since their distances from the reference plane Rp are equal to each other.

In the above embodiments, a configuration example is shown in which the vibration suppression part has the abutting surface 123a and is in surface contact with the beam 21a. However, the disclosure is not limited thereto. For example, the vibration suppression part may be configured to be in point contact with the beam 21a. Even if the vibration suppression part is in point contact with the beam 21a, the same effects may be achieved if the position where the vibration suppression part contacts the beam 21a is set between the second mirror end 20b and the torsion part 21c.

In the above embodiments, a configuration example is shown in which the vibration suppression part is configured separately from the substrate 21 and the holding member 24. However, the disclosure is not limited thereto. For example, the vibration suppression part may be integrally formed with the substrate 21 or the holding member 24. In the case where the vibration suppression part is integrally formed with the substrate 21, by changing the size of the second end 121b side of the pair of beams 21a in the second direction (X direction), vibration is able to be suppressed. Hence, for example, the holding part 21d in the above embodiments may be taken as the vibration suppression part. In the case where the vibration suppression part is integrally formed with the holding member 24, the same effects may be achieved if the end on the Y1 direction side of the portion for fixing the substrate 21 is taken as the vibration suppression part.

In the above embodiments, a configuration example is shown in which the holding member 24 holds each of the pair of beams 21a at the position nearer the second end 121b than the position where the vibration suppression part abuts against the pair of beams 21a. However, the disclosure is not limited thereto. For example, the holding member 24 may be configured to hold each of the pair of beams 21a at the position where the vibration suppression part abuts against the pair of beams 21a.

In the above embodiments, a configuration example is shown in which the vibration suppression part includes the first vibration suppression part 23a and the second vibration suppression part 23b. However, the disclosure is not limited thereto. For example, a single vibration suppression part may be configured to suppress vibration of the pair of beams 21a by abutting against both of the pair of beams 21a.

In the above embodiments, a configuration example is shown in which the first distance D1 and the second distance D2 are equal. However, the disclosure is not limited thereto. For example, the substrate 21 may be configured so that the second distance D2 is smaller than the first distance D1.

In the above embodiments, a configuration example is shown in which the third distance D5 is smaller than the first distance D1. However, the disclosure is not limited thereto. For example, the vibration suppression part may be configured so that the third distance D5 is equal to the first distance D1.

In the above embodiments, a configuration example is shown in which the adhesive 26 joins the mirror part 20 and the mirror part arrangement part 25 at eight joining positions. However, the disclosure is not limited thereto. The number of joints where the adhesive 26 joins the mirror part 20 and the mirror part arrangement part 25 may be any number equal to or greater than two.

In the above embodiments, a configuration example is shown in which the adhesive 26 joins the mirror part 20 and the mirror part arrangement part 25 at the joining positions at substantially equal distances from the center of gravity G of the mirror part 20. However, the disclosure is not limited thereto. For example, the adhesive 26 may join the mirror part 20 and the mirror part arrangement part 25 at the joining positions at substantially equal distances from the center of the surface of the mirror part 20.

In the above embodiments, a configuration example is shown in which the mirror part arrangement part 25 is thinned so as to have a symmetrical mass on the reference plane Rp containing the center of gravity G of the mirror part 20. However, the disclosure is not limited thereto. For example, the mirror part arrangement part 25 may be thinned so as to have a symmetrical mass on a reference plane containing the center of the surface of the mirror part 20.

In the above embodiments, a configuration example is shown in which the weight member 27 is integrally formed with the substrate 21. However, the disclosure is not limited thereto. For example, the weight member 27 may be configured separately from the substrate 21, and may be configured to be arranged on the substrate 21.

In the above embodiments, a configuration example is shown in which the antireflection treatment is applied to the portion of the substrate 21 in the vicinity of the mirror part 20 and the surface of the driving source 22. However, the disclosure is not limited thereto. For example, the antireflection treatment may be applied to neither the portion of the substrate 21 in the vicinity of the mirror part 20 nor the surface of the driving source 22. However, since the light reflected by a component other than the mirror part 20 becomes noise in the case where the antireflection treatment is applied to neither the portion of the substrate 21 in the vicinity of the mirror part 20 nor the surface of the driving source 22, the antireflection treatment is preferably applied to at least one of the portion of the substrate 21 in the vicinity of the mirror part 20 and the surface of the driving source 22. In order to further suppress the reflection of light by a component other than the mirror part 20, the antireflection treatment is more preferably applied to the portion of the substrate 21 in the vicinity of the mirror part 20 and the surface of the driving source 22.

In the above embodiments, a configuration example is shown in which the substrate 21 has a U-shape. However, the disclosure is not limited thereto. The substrate 21 may have a shape other than the U-shape as long as the first ends 121a of the pair of beams 21a are supported by the support 21b.

What is claimed is:

1. A vibrating mirror element comprising:
    a mirror part reflecting light;
    a substrate made of metal and comprising:
        a pair of beams each having a first end and a second end,
        a support supporting the first end of each of the pair of beams, and
        a torsion part swingably supporting the mirror part;
    a driving source provided on the support and generating a plate wave that swings the mirror part; and
    a vibration suppression part suppressing vibration transmitted to the pair of beams by abutting against the pair of beams, wherein
    the torsion part extends in a second direction orthogonal to a first direction in which the pair of beams extends in a direction along a surface of the mirror part, and is connected to each of the pair of beams;
    the vibration suppression part is configured to suppress the vibration transmitted to the pair of beams by abutting against the pair of beams at a position between a second mirror end among ends of the mirror part that is opposite a first mirror end near the support and the torsion part in the first direction.

2. The vibrating mirror element according to claim 1, further comprising:
    a holding member holding the support and holding each of the pair of beams, wherein
    the holding member is configured to hold each of the pair of beams at a position where the vibration suppression part abuts against the pair of beams or at a position nearer the second end than the position where the vibration suppression part abuts against the pair of beams.

3. The vibrating mirror element according to claim 2, wherein
    the vibration suppression part comprises:
        a first vibration suppression part suppressing vibration by abutting against one of the pair of beams, and
        a second vibration suppression part provided separately from the first vibration suppression part and suppressing vibration by abutting against the other of the pair of beams, wherein
    each of the first vibration suppression part and the second vibration suppression part is provided separately from the substrate and the holding member;
    the holding member has a carrying surface carrying the first vibration suppression part and the second vibration suppression part;
    the carrying surface is formed so as to extend in the first direction.

4. The vibrating mirror element according to claim 1, wherein the mirror part is configured so that a first distance from the torsion part to the second mirror end in the first direction is equal to or greater than a second distance from the torsion part to the second end in the first direction.

5. The vibrating mirror element according to claim 4, wherein the vibration suppression part is configured so that a third distance from the torsion part to an end of the vibration suppression part near the second end in the first direction is less than the first distance.

6. The vibrating mirror element according to claim 1, wherein
    the mirror part is provided separately from the substrate;
    the substrate further comprises a mirror part arrangement part connected to the torsion part, the mirror part being arranged in the mirror part arrangement part;
    the torsion part is provided so as to extend in the second direction so as to overlap the mirror part, and is connected with the mirror part arrangement part at a position overlapping the mirror part in the second direction.

7. The vibrating mirror element according to claim 6, wherein the mirror part and the mirror part arrangement part are joined at at least two places by an adhesive having elasticity.

8. The vibrating mirror element according to claim 7, wherein the adhesive joins the mirror part and the mirror part arrangement part at least at two places at substantially equal distances from a center of gravity of the mirror part or from a center of a surface of the mirror part.

9. The vibrating mirror element according to claim 6, wherein the mirror part arrangement part is thinned and formed into a beam shape so as to have a symmetrical mass on a reference plane containing a center of gravity of the mirror part or a center of a surface of the mirror part.

10. The vibrating mirror element according to claim 1, wherein a weight member is provided on the driving source or the pair of beams.

11. The vibrating mirror element according to claim 1, wherein a treatment preventing reflection of the light reflected by the mirror part is applied to at least one of a portion of the substrate in the vicinity of the mirror part and a surface of the driving source.

12. An optical scanner comprising:
    a light source irradiating light;
    a mirror part reflecting the light irradiated from the light source;
    a substrate made of metal and comprising:
        a pair of beams each having a first end and a second end,
        a support supporting the first end of each of the pair of beams, and
        a torsion part swingably supporting the mirror part;
    a driving source provided on the support and generating a plate wave that swings the mirror part; and
    a vibration suppression part suppressing vibration transmitted to the pair of beams by abutting against the pair of beams, wherein
    the torsion part extends in a second direction orthogonal to a first direction in which the pair of beams extends in a direction along a surface of the mirror part, and is connected to each of the pair of beams;
    the vibration suppression part is configured to suppress the vibration transmitted to the pair of beams by abutting against the pair of beams at a position between a second mirror end among ends of the mirror part that is opposite a first mirror end near the support and the torsion part in the first direction.

* * * * *